(12) United States Patent
Guo et al.

(10) Patent No.: US 10,903,821 B1
(45) Date of Patent: Jan. 26, 2021

(54) COMPLEMENTARY METAL-OXIDE SEMICONDUCTOR (CMOS) COMPATIBLE RF SWITCH AND HIGH VOLTAGE CONTROL CIRCUIT (HVCC)

(71) Applicant: Qorvo US, Inc., Greensboro, NC (US)

(72) Inventors: Yan Guo, Santa Clara, CA (US);
Patrick T. Clancy, Santa Cruz, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/540,573

(22) Filed: Aug. 14, 2019

(51) Int. Cl.
*H03K 3/012* (2006.01)
*H03K 19/0185* (2006.01)
*H04B 1/40* (2015.01)
*H03K 17/693* (2006.01)

(52) U.S. Cl.
CPC ..... *H03K 3/012* (2013.01); *H03K 19/018507* (2013.01); *H04B 1/40* (2013.01)

(58) Field of Classification Search
CPC ........... H03K 3/012; H03K 19/018507; H03K 19/0005; H03K 17/693; H03K 2217/0036; H03K 2217/0054; H03K 3/356052; H03K 3/356147; H04B 1/40; H01L 2223/6677; H01L 23/66
See application file for complete search history.

(56) References Cited

U.S. PATENT DOCUMENTS

2014/0049311 A1\* 2/2014 Yang .................... H03K 17/162
327/427

OTHER PUBLICATIONS

Parthasarathy, Shyam, et al., "RF SOI Switch FET Design and Modeling Tradeoffs for GSM Applications," 23rd International Conference on VLSI Design, 2010, IEEE Computer Society, pp. 194-199.
Zhang, Zhihao, et al., "A Novel Low-loss High-isolation DP5T SOI CMOS Switch in MCM for Multi-band Applications," Asia-Pacific Microwave Conference, 2015, IEEE, 3 pages.

\* cited by examiner

*Primary Examiner* — Wei (Victor) Y Chan
(74) *Attorney, Agent, or Firm* — Withrow & Terranova, P.L.L.C.

(57) ABSTRACT

A complementary metal-oxide semiconductor (CMOS) compatible radio frequency (RF) switch circuit and high voltage control circuit (HVCC) are disclosed. In a mobile device, an RF switch circuit couples a first RF circuit to a shared antenna through a low resistance path while electrically isolating other RF circuits from the antenna by a high resistance path. Each path in the RF switch circuit includes a series metal-oxide semiconductor (MOS) Field-Effect Transistor (FET) MOSFET switch which provides a low resistance path when fully turned on by a strong positive gate-to-source voltage and a corresponding body bias voltage, and a high resistance path when fully turned off by a strong negative gate-to-source voltage and corresponding body bias voltage. The RF switch circuit paths are controlled by a CMOS compatible HVCC which supplies high and low voltage signals to the gate node and body bias node of each MOSFET in each path.

17 Claims, 9 Drawing Sheets

US 10,903,821 B1

COMPLEMENTARY METAL-OXIDE SEMICONDUCTOR (CMOS) COMPATIBLE RF SWITCH AND HIGH VOLTAGE CONTROL CIRCUIT (HVCC)

FIELD OF THE DISCLOSURE

The present disclosure relates generally to complementary metal-oxide semiconductor (CMOS) switches and, more specifically, to CMOS circuits for radio frequency (RF) single pole multi-throw switches.

BACKGROUND

Wireless communication is compulsory in mobile electronic devices. A mobile device may have multiple wireless radio frequency (RF) interfaces (e.g., cellular, Bluetooth, WiFi, etc.) that are each handled by separate dedicated RF transmit and receive circuits (RF circuits). These multiple RF circuits may share a single antenna to reduce the physical size and cost of a mobile device. Antenna sharing is accomplished in a time division duplex (TDD) system by employing an RF switch to selectively couple one of the RF circuits to the antenna while isolating the antenna from the other RF circuits. The quality of an RF switch in a TDD system is determined by measurable parameters related to how an RF signal is passed between a selected RF circuit and an antenna, and how well the unselected RF circuits are electrically isolated from the antenna. These measurable parameters include insertion loss, isolation, and power handling (P1 dB) capabilities, among others.

High quality RF switches may be formed of metal-oxide semiconductor (MOS) Field-Effect Transistors (FETs) (MOSFETs) in silicon-on-insulator (SOI) circuits. To provide an electrical path with minimal resistance, a MOSFET must be fully turned on. Fully turning on a MOSFET requires a strong positive gate-to-source voltage $V_{GS}$. To provide the electrical isolation needed in an RF device, the MOSFET must be fully turned off, which requires a strong negative $V_{GS}$ (i.e., gate voltage lower than source voltage). The gate of a MOSFET may be referred to herein as a gate node or a gate terminal. Similar terminology may also be used for the source, drain, and body of a MOSFET.

One characteristic of a MOSFET is the maximum positive or negative voltage (referred to herein as "rated voltage $V_{MAX}$") that can be applied between any two terminals of the MOSFET without causing permanent damage. Thus, the maximum voltages that can be applied to a MOSFET between the gate node and the source node ($V_{GS}$), which may be referred to herein as the gate-to-source voltage $V_{GS}$, to fully turn on or fully turn off the MOSFET is the rated voltage $V_{MAX}$. A gate-to-source voltage $V_{GS}$ having a magnitude less than the rated voltage $V_{MAX}$ may be sufficiently strong to fully turn on or turn off the MOSFET. The voltage levels needed to turn on and turn off the MOSFET may be supplied by a voltage controller. Various methods of providing $V_{GS}$ to turn on and turn off an RF switch circuit comprising a MOSFET are described with respect to the following examples.

FIG. 1 is a schematic diagram of a conventional RF switch circuit 100 and controller 102 in which the controller 102 employs a charge pump (not shown). The RF switch circuit 100 is a single pole double throw (SPDT) series-shunt switch in which an antenna node 104 may be coupled to a transmit (TX) circuit 106 or a receive (RX) circuit 108 in a TDD system. The RF switch circuit 100 alternates between a RX state to receive a wireless signal, and a TX state to transmit a wireless signal.

In the TX state, the antenna node 104 is electrically coupled to the TX circuit 106 through a transmit series MOSFET switch (transmit series switch) 110T, which is turned on, so the TX circuit 106 can transmit a signal through an antenna (not shown) coupled to the antenna node 104. The antenna node 104 is electrically isolated from the RX circuit 108 by a receive series switch 110R, which is turned off. In the TX state, a transmit shunt switch 112T is also turned off to prevent the output of the TX circuit 106 from being shorted to ground. In addition, the receive shunt switch 112R is turned on so the input to the RX circuit 108 is coupled to ground in the TX state to improve isolation of the RX circuit 108 from the antenna node 104.

In the RX state, the on/off states of the switches 110T, 110R, 112T, and 112R in the RF switch circuit 100 are reversed with respect to the TX state. Specifically, the antenna node 104 is electrically coupled to the input of the RX circuit 108 through the receive series switch 110R, which is turned on, and the antenna node 104 is electrically isolated from the TX circuit 106 by the transmit series switch 110T, which is turned off. In the RX state, the receive shunt switch 112R is turned off to isolate the input of the RX circuit 108 from ground. In addition, turning on the transmit shunt switch 112T in the RX state couples the output of the TX circuit 106 to ground to improve isolation of the TX circuit 106 from the antenna 104.

The controller 102 controls the RF switch circuit 100, based on a switch control input SW, to switch between the RX state and the TX state by providing signals with appropriate gate voltages (G1/G3, G2/G4) and body bias voltages (B1/B3 and B2/B4) to the series switches 110T and 110R and the shunt switches 112T and 112R. The gate voltages and body bias voltages that must be generated by the controller 102 depend on the voltage levels applied to the respective source nodes and drain nodes of the switches 110T, 110R, 112T, and 112R. In the example in FIG. 1, the antenna node 104 has an average DC voltage of 0 volts (V). With the antenna node 104 coupled to a terminal of the transmit series switch 110T and a terminal of the receive series switch 110R, 0 V is applied to a node of each of the transmit series switch 110T and the receive series switch 110R. Since the maximum voltage between any two terminals of a MOSFET switch cannot exceed the rated voltage $V_{MAX}$ of the MOSFET, and one terminal is supplied with 0 V, the transmit series switches 110R and 110T are turned on by supplying 2.5 V to their gate nodes G2 and G3, which applies the rated voltage $V_{MAX}$ as a positive gate-to-source voltage $V_{GS}$. The transmit series switches 110T and 110R are turned off by supplying −2.5 V to their gate nodes G2 and G3, which applies the rated voltage $V_{MAX}$ as a negative gate-to-source voltage $V_{GS}$.

Body bias voltages are also applied to decrease or increase the threshold voltages of the MOSFET switches. The body bias voltage helps to enhance the turn-on and turn-off states. In particular, to enhance the turn-on state of the transmit series switch 110T or the receive series switch 110R, a body bias voltage of 0 V is applied, and to enhance the turn-off state of the transmit series switch 110T or the receive series switch 110R, a body bias voltage of −2.5 V is applied. Therefore, in the example in FIG. 1, in the TX state, a gate voltage of 2.5 V is applied to the gate node G2, and a body bias voltage of 0 V is applied to the body bias node B2 to fully turn on the transmit series switch 110T. A gate voltage of −2.5 V is applied to the gate node G3 and a body bias voltage of −2.5 V is applied to the body bias node B3 to fully turn off the receive series switch 110R. In the RX state, the gate voltage of −2.5 V is applied to the gate node G2, and the body bias voltage of −2.5 V is applied to the body bias node B2 to turn off the transmit series switch 110T. A voltage of 2.5 V is applied to the gate node G3, and a voltage of 0 V is applied to the body bias node B3 to turn on the receive series switch 110R.

Each of the transmit shunt switch 112T and the receive shunt switch 112R has a node coupled to ground (0 V), which is the same DC voltage level as the antenna node 104. Therefore, the same voltages applied to the series switches 110T and 110R can be employed to turn on and turn off the transmit shunt switch 112T and the receive shunt switch 112R. Thus, in the TX state, −2.5 V is applied to the gate node G1 of the transmit shunt switch 112T, 2.5 V is applied to the gate node G4 of the receive shunt switch 112R, −2.5V is applied to the body bias node B1 of the transmit shunt switch 112T, and 0 V is applied to the body bias node B4 of the receive shunt switch 112R. In the RX state, 0 V is applied to the gate node G1, −2.5 V is applied to the body bias node B1, −2.5 V is applied to the gate node G4, and 0 V is applied to the body bias node B4.

The 2.5 V needed to turn on switches in the RF switch circuit 100 can be derived from the power supply voltage (e.g., 5 V), but a charge pump circuit (not shown) is employed to provide the −2.5 V. Charge pumps lose power due to leakage current when they are turned on. Some applications, such as a WiFi front end module (FEM) which requires a fast switching speed and a fast switching rate, require the charge pump to be kept on at all times, including during sleep mode, which causes a large loss of power due to leakage current. Charge pumps also generate unwanted voltage spurs that interfere with wireless transmission and reception.

FIG. 2 is a schematic diagram of another conventional RF switch circuit 200 and a controller 202. The RF switch circuit 200 includes large capacitors $C_{T1}$, $C_{T2}$, $C_{T3}$, $C_{T4}$, $C_{R1}$, $C_{R2}$, $C_{R3}$, and $C_{R4}$ (capacitors $C_{Tn/Rn}$) coupled to the source and drain of the MOSFET switches. The RF switch circuit 200 is a single pole double throw (SPDT) series-shunt switch in which an antenna node 204 may be coupled to a TX circuit 206 in a TX state, and coupled to a RX circuit 208 in a RX state in a TDD system. The arrangement of the series switches 210T and 210R and the shunt switches 212T and 212R with respect to each other and with respect to the antenna node 204 corresponds to the arrangement of the series switches 110T and 110R and the shunt switches 112T and 112R with respect to each other and with respect to the antenna node 104 in the RF switch circuit 100 in FIG. 1. The controller 202 controls the RF switch circuit 200, based on a switch control input SW, to switch between the RX state and the TX state by providing signals with appropriate gate voltages (G1/G3, G2/G4) and body bias voltages (B1/B3 and B2/B4) to the series switches 210T and 210R and the shunt switches 212T and 212R. Thus, operation of the RF switch circuit 200 with regard to the turn-on and turn-off states of the series switches 210T and 210R and the shunt switches 212T and 212R corresponds to the operation of the RF switch circuit 100 and the states of the series switches 110T and 110R and the shunt switches 112T and 112R as described above with regard to FIG. 1. Therefore, a further description of the operation of the RF switch circuit 200 in this regard is not provided.

The RF switch circuit 200 differs from the RF switch circuit 100 with regard to the voltages applied to turn on and turn off the MOSFETs. In the RF switch circuit 200, capacitors $C_{T1}$-$C_{T4}$ and $C_{R1}$-$C_{R4}$ are employed to provide different voltages to the source nodes and drain nodes of the MOSFETs in the RF switch circuit 200. The addition of the capacitors $C_{T1}$-$C_{T4}$ and $C_{R1}$-$C_{R4}$ eliminates the need for a negative voltage, which eliminates the need for a charge pump as employed in the RF switch circuit 100.

The capacitors $C_{T1}$-$C_{T4}$ and $C_{R1}$-$C_{R4}$ are dynamically charged and discharged by the controller 202 in transitions between the TX state and the RX state. Specifically, capacitors $C_{T1}$ and $C_{T2}$ are charged in the TX state to provide 2.5 V to the source/drain nodes of the transmit shunt switch 212T. Consequently, supplying 0 V at the gate node G1 applies a negative gate-to-source voltage $V_{GS}$ at the rated voltage $V_{MAX}$, and supplying 0 V at the body bias node B1 enhances the turn-off state of the transmit shunt switch 212T. Capacitors $C_{T3}$ and $C_{T4}$ are discharged in the TX state to provide 0 V to the source/drain nodes of the transmit series switch 210T. Consequently, supplying 2.5 V to the gate node G2 applies the rated voltage $V_{MAX}$ as a positive gate-to-source voltage $V_{GS}$, and supplying 2.5 V to the body bias node B2 enhances the turn-on state of the transmit series switch 210T. Capacitors $C_{R1}$ and $C_{R2}$ are charged in the TX state to provide 2.5 V to the source/drain nodes of the receive series switch 210R. Consequently, supplying 0 V to the gate node G3 applies a negative gate-to-source voltage $V_{GS}$ at the rated voltage $V_{MAX}$, and supplying 0 V at the body bias node B3 enhances the turn-off state of the receive series switch 210R. Capacitors $C_{R3}$ and $C_{R4}$ are discharged in the TX state to provide 0 V to the source/drain nodes of the receive shunt switch 212R. Consequently, supplying 2.5 V to the gate node G4 applies a positive gate-to-source voltage $V_{GS}$ at the rated voltage $V_{MAX}$, and supplying 2.5 V at the body bias node B4 enhances the turn-on state of the receive shunt switch 212R. In the RX state, the capacitors $C_{T1}$, $C_{T2}$, $C_{R1}$ and $C_{R2}$ are discharged to 0 V, and the capacitors $C_{T3}$, $C_{T4}$, $C_{R3}$ and $C_{R4}$ are charged to 2.5 V. The voltages supplied to the gate nodes and body bias nodes in the RX state to turn on and turn off the respective switches is understood from the above description of the TX state.

While the RF switch circuit 200 in FIG. 2 eliminates the need for the charge pump employed in the controller 102, the addition of the capacitors $C_{T1}$-$C_{T4}$ and $C_{R1}$-$C_{R4}$ increases the size and cost of the RF switch circuit 200 in comparison to the RF switch circuit 100. In addition, the time consumed in the charging and discharging of the capacitors $C_{T1}$-$C_{T4}$ and $C_{R1}$-$C_{R4}$ every time the RF switch circuit 200 transitions between the TX state and the RX state (and vice versa) limits the switching speed of the RF switch circuit 200, which limits the applicability of the RF switch circuit 200 in applications where fast switching is required.

FIG. 3 is a schematic diagram of an RF switch circuit 300 that does not include a charge pump as in the RF switch circuit 100, and includes fewer capacitors than in the RF switch circuit 200. The RF switch circuit 300 is a single pole double throw (SPDT) series-shunt switch in which an antenna node 304 may be coupled to a TX circuit 306 in a TX state, and coupled to a RX circuit 308 in a RX state in a TDD system. The arrangement of series switches 310T and 310R and the shunt switches 312T and 312R with respect to each other and with respect to the antenna node 304 corresponds to the arrangement of the series switches 110T and 110R and the shunt switches 112T and 112R with respect to each other and with respect to the antenna node 104 in the RF switch circuit 100 in FIG. 1. A controller 302 controls the RF switch circuit 300, based on a switch control input SW, to switch between the RX state and the TX state by providing signals with appropriate gate voltages (G1/G3, G2/G4) and body bias voltages (B1/B3 and B2/B4) to the series switches 310T and 310R and the shunt switches 312T and 312R. Thus, operation of the RF switch circuit 300 with regard to the turn-on and turn-off states of the series switches 310T and 310R and the shunt switches 312T and 312R corresponds to the operation of the RF switch circuit 100 and the states of the series switches 110T and 110R and the shunt switches 112T and 112R as described above with regard to FIG. 1. Therefore, a further description of the operation of the RF switch circuit 300 in this regard is not provided.

In the RF switch circuit 300, capacitor $C_T$ is coupled between the transmit shunt switch 312T and ground, capacitor $C_A$ is coupled between the antenna node 304 and an antenna (not shown), and capacitor $C_R$ is coupled between the receive shunt switch 312R and ground. The capacitors $C_T$ and $C_R$ are charged to the voltage of roughly one diode drop (e.g., +0.9 V), but they are not charged and discharged between the TX and RX states. Therefore, the capacitors $C_T$ and $C_R$ do not slow down performance of the RF switch circuit 300. Logic circuits of the controller 302 are MOSFET circuits that have a rated voltage $V_{MAX}$ (e.g., +2.5 V). Thus, the controller 302 provides a maximum voltage of 2.5 V and a minimum voltage of 0 V. With reference to the transmit shunt switch 312T, as an example, supplying 0 V to the gate G1 of the transmit shunt switch 312T provides a negative gate-to-source voltage $V_{GS}$ of 0.9 V. At a negative gate-to-source voltage $V_{GS}$ of 0.9 V, the transmit shunt switch 312T is turned off, but is not strongly turned off. As a result, a resistance between the source and drain of the transmit shunt switch 312T is not maximized, which results in power loss due to leakage current. On the other hand, supplying 2.5 V to the gate G1 of the transmit shunt switch 312T applies a positive gate-to-source voltage $V_{GS}$ of 1.6 V. At a positive gate-to-source voltage $V_{GS}$ of 1.6 V, the transmit shunt switch 312T is turned on, but is not strongly turned on. As a result, the resistance of the electrical path between the source and drain of the transmit shunt switch 312T is not minimized, so the maximum current level is reduced, which reduces the power capability of the switch. Thus, although the problems associated with the RF switch circuits 100 and 200 are avoided, the RF switch circuit 300 does not provide competitive performance and cost.

SUMMARY

Aspects disclosed herein include a complementary metal-oxide semiconductor (CMOS) compatible radio-frequency (RF) switch circuit and high voltage control circuit (HVCC). In a mobile device, one antenna is shared among a plurality of RF circuits that transmit or receive wireless communication in a time division manner. An RF switch circuit couples a first RF circuit to the antenna through a low resistance path while electrically isolating one or more other RF circuits from the antenna by a high resistance path. Each path in the RF switch circuit includes a series metal-oxide semiconductor (MOS) Field-Effect Transistor (FET) (MOSFET) switch. A series MOSFET switch provides a low resistance path when fully turned on by a strong positive gate-to-source voltage $V_{GS}$ and a corresponding body bias voltage. The series MOSFET switch provides a high resistance path when fully turned off by a strong negative gate-to-source voltage $V_{GS}$ and corresponding body bias voltage. The MOSFETs in the RF switch circuit paths are controlled by signals from a HVCC formed of standard CMOS compatible circuits. The HVCC supplies high and low voltage signals to the gate node and body bias node of each MOSFET in each path of the RF switch circuit. The HVCC is formed of standard CMOS logic circuits for a cost effective, high performance, low noise (spur-free) RF switch circuit.

In one aspect, an RF switch circuit is disclosed. The RF switch circuit includes a primary node configured to couple to a circuit component. The RF switch circuit also includes a first RF path. The first RF path includes a first series switch having a rated voltage. The first series switch is configured to couple a first RF node to the primary node in response to a gate node-to-source node voltage and a body bias voltage of the first series switch. The RF switch circuit also includes a second RF path. The second RF path includes a second series switch having the rated voltage. The second series switch is configured to couple a second RF node to the primary node in response to a gate node-to-source node voltage and a body bias voltage of the second series switch. The RF switch circuit also includes an HVCC. The HVCC is configured to supply a reference voltage to a gate node and a body bias node of a first one of the first and second series switches. The HVCC is also configured to supply a power supply voltage to the gate node of a second one of the first and second series switches. The HVCC is also configured to supply a medial voltage between the reference voltage and the power supply voltage to the body bias node of the second one of the first and second series switches. A difference in magnitude between the reference voltage and the power supply voltage exceeds the magnitude of the rated voltage of the first and second series switches.

In another aspect, a method of controlling an RF switch circuit is disclosed. The method includes controlling a first series switch including a rated voltage to couple a first RF node of a first RF circuit to a primary node in a first mode. Controlling the first series switch includes supplying a power supply voltage to a gate node of the first series switch, supplying a medial voltage to a body bias node of the first series switch, and supplying a reference voltage to a gate node of a second series switch and a body bias node of the second series switch. The method also includes controlling the second series switch including the rated voltage to couple a second RF node of a second RF circuit to the primary node in a second mode. Controlling the second series switch circuit includes supplying the power supply voltage to the gate node of the second series switch, supplying the medial voltage to the body bias node of the second series switch, and supplying the reference voltage to the gate node of the first series switch and the body bias node of the first series switch. A difference between the power supply voltage and the reference voltage exceeds the rated voltage of the first series switch and the second series switch.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

Figure 5:
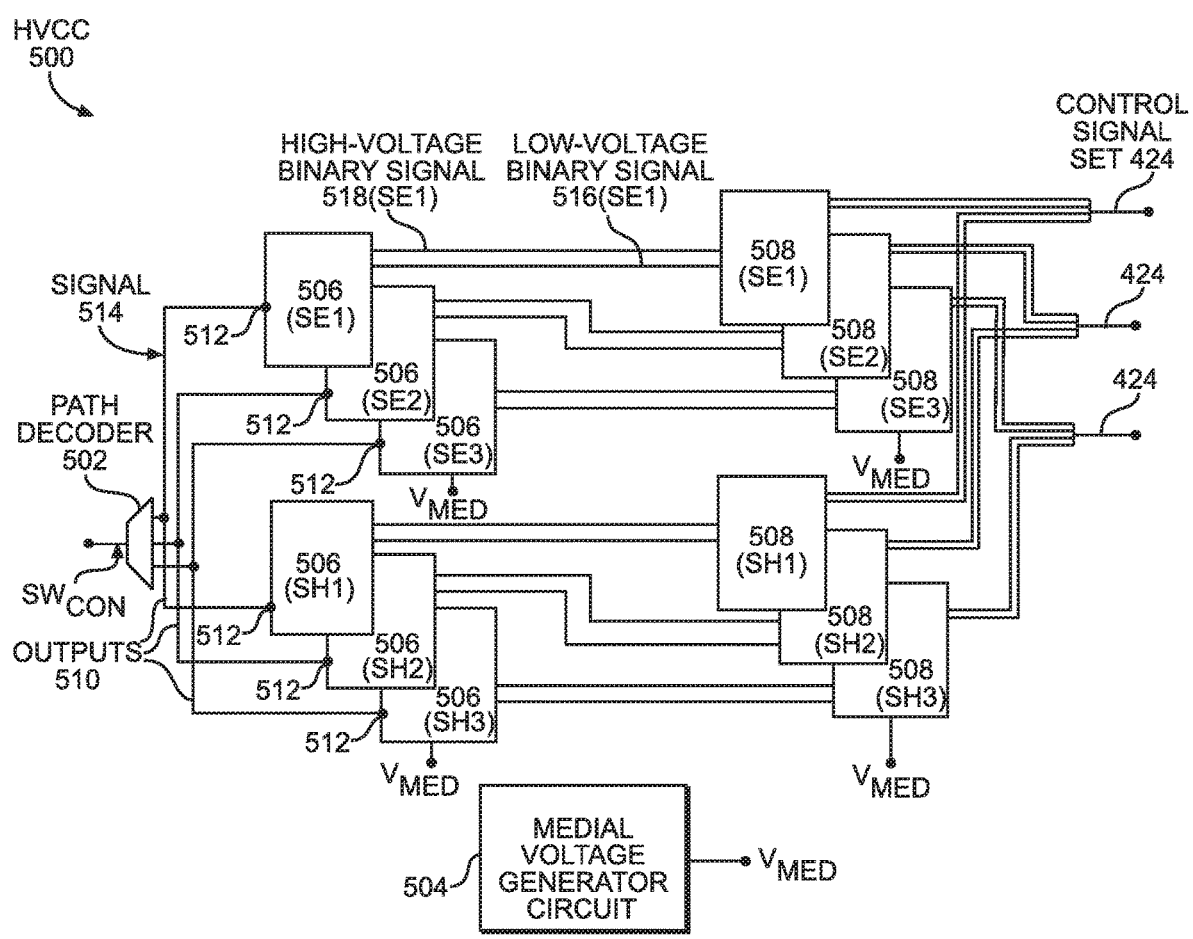
FIG. 5 is a schematic diagram of the exemplary HVCC of FIG. 4, including a medial voltage generator, first and second logic level shifters, and first and second high voltage switch driver circuits.
Figure 7:
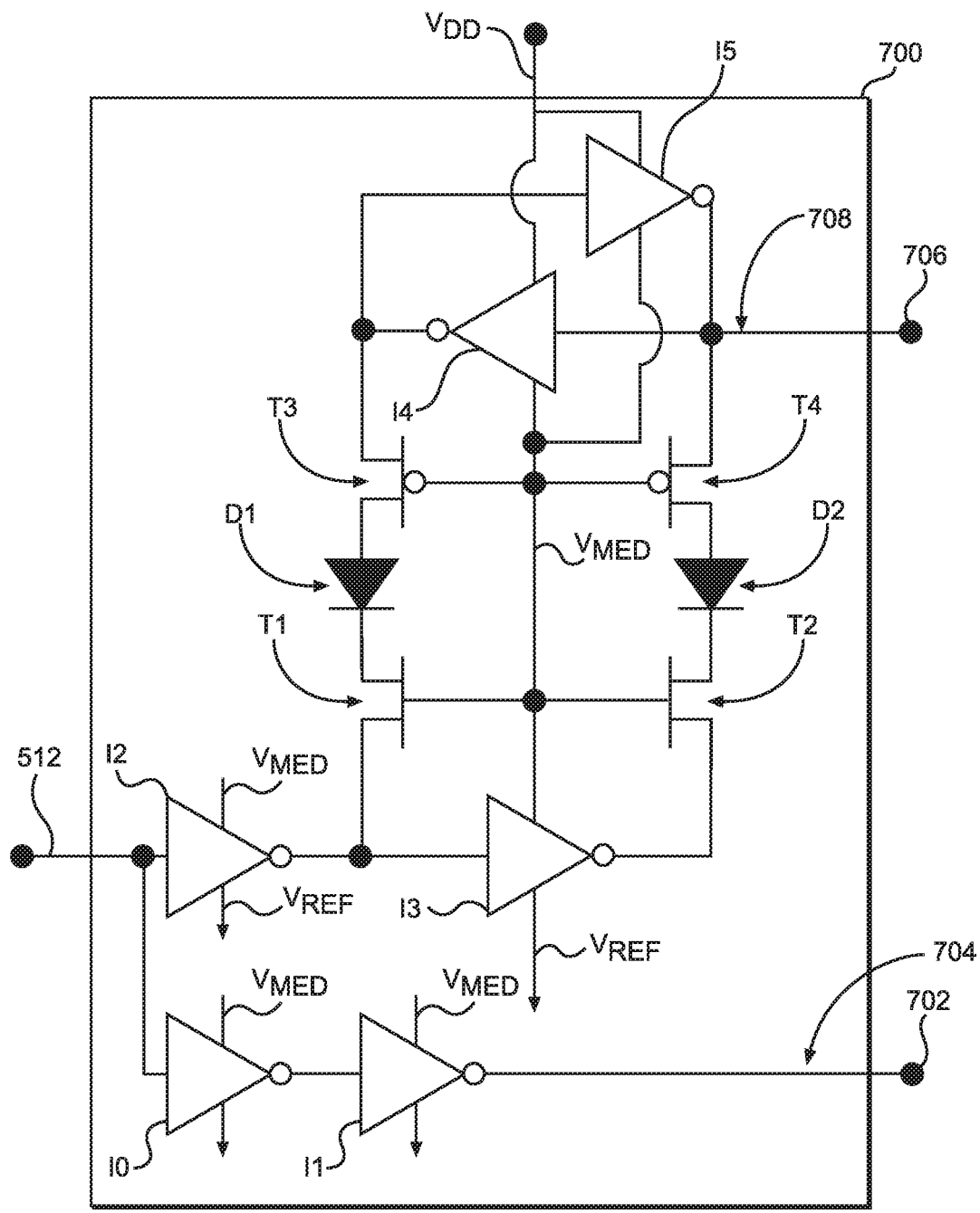
Figure 8:
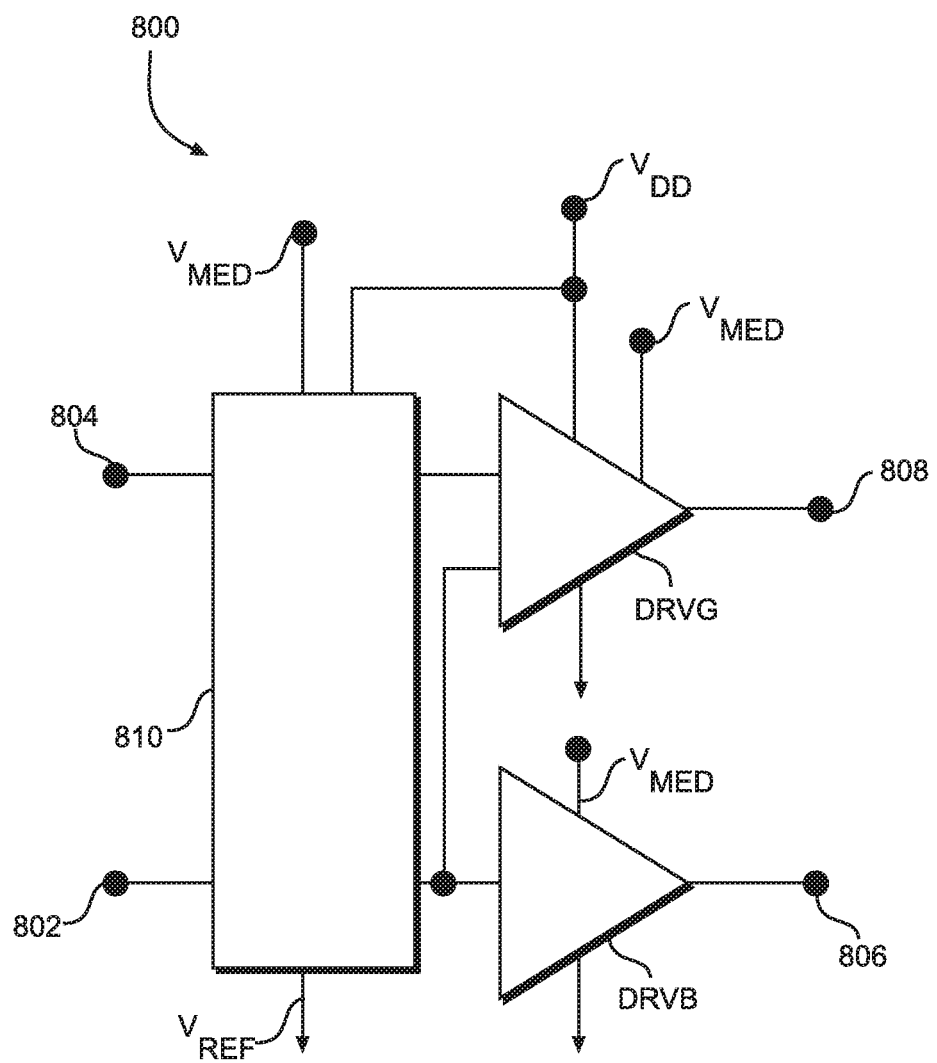

FIG. 7 is a schematic diagram of an exemplary level shifter of the HVCC in FIG. 5 employing standard CMOS logic devices to convert a control signal to a power supply voltage level; and FIG. 8 is a schematic diagram of an exemplary high voltage switch driver employing standard CMOS logic devices to generate gate node and body bias voltages for MOSFET switches in an RF switch circuit according to a power supply voltage.

DETAILED DESCRIPTION

Those skilled in the art will appreciate the scope of the present disclosure and realize additional aspects thereof after reading the following detailed description of the preferred embodiments in association with the accompanying drawing figures.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Those skilled in the art will recognize improvements and modifications to the preferred embodiments of the present disclosure, such as logical equivalents or logical minimization to avoid redundancy. All such improvements and modifications are considered within the scope of the concepts disclosed herein and the claims that follow.

Aspects disclosed herein include a complementary metal-oxide semiconductor (CMOS) compatible radio-frequency (RF) switch circuit and high voltage control circuit (HVCC). In a mobile device, one antenna is shared among a plurality of RF circuits that transmit or receive wireless communication in a time division manner. An RF switch circuit couples a first RF circuit to the antenna through a low resistance path while electrically isolating one or more other RF circuits from the antenna by a high resistance path. Each path in the RF switch circuit includes a series metal-oxide semiconductor (MOS) Field-Effect Transistor (FET) (MOSFET) switch. A series MOSFET switch provides a low resistance path when fully turned on by a strong positive gate-to-source voltage $V_{GS}$ and a corresponding body bias voltage. The series MOSFET switch provides a high resistance path when fully turned off by a strong negative gate-to-source voltage $V_{GS}$ and corresponding body bias voltage. The MOSFETs in the RF switch circuit paths are controlled by signals from a HVCC formed of standard CMOS compatible circuits. The HVCC supplies high and low voltage signals to the gate node and body bias node of each MOSFET in each path of the RF switch circuit. The HVCC is formed of standard CMOS logic circuits for a cost effective, high performance, low noise (spur-free) RF switch circuit.

The voltages provided to gate nodes and body bias nodes of MOSFETs in an RF switch circuit depend on the voltages supplied to the source/drain nodes of the MOSFET and on whether a strong turn on and turn off voltage is desired. Thus, the requirements of an RF switch circuit controller depend on the RF switch circuit to be controlled. In the example in FIG. 1, the rated voltage $V_{MAX}$ is applied as the positive gate-to-source voltage $V_{GS}$ to turn on the MOSFET, and the rated voltage $V_{MAX}$ is also applied as the negative gate-to-source voltage $V_{GS}$ to turn off the MOSFET. Since the RF switch circuit 100 does not include any capacitors to adjust source/drain node voltages from the reference voltage $V_{REF}$ (0 volts (V)), the controller 102 is required to provide negative voltage, which requires a charge pump to be employed in the controller 102, causing power loss and voltage spurs. In the example in FIG. 2, capacitors are included in the RF switch circuit 200 to adjust the source/drain nodes above the reference voltage $V_{REF}$ in one state (TX or RX) and adjust the source/drain nodes back to the reference voltage $V_{REF}$ in the other state. While the RF switch circuit 200 avoids the need for a charge pump in the controller 202, the need to adjust the source/drain node voltages according to the state of the RF switch circuit 200 requires the addition of eight capacitors that are charged and discharged, which increases cost and slows the switching speed of the RF switch circuit 200. In the example in FIG. 3, the RF switch circuit 300 requires only three more capacitors than the RF switch circuit 100, and the controller 302 does not include a charge pump, but the MOSFETs therein are never fully turned on or off because a strong gate-to-source voltage $V_{GS}$ is never applied. One of the limitations in the controller 302 is the maximum range of voltages that are generated. Even though the RF switch circuit 300 may have a power supply voltage $V_{DD}$ of 5 V available, the signals generated by the controller 302 have voltages of either 0 V or 2.5 V.

RF CMOS on silicon-on-insulator (SOI) is employed for implementation of an antenna switch and a RX Shuntable low noise amplifier (LNA), requiring switches with low loss, low harmonics, low distortion, high isolation, and high power handling while being integrated with low noise, low distortion LNAs, in the lowest cost possible. The RF switch circuit and the HVCC disclosed herein provide a performance-competitive switch solution with standard voltage logic devices, eliminating charge pump circuitry commonly used to get larger terminal voltages for optimized switch performance, reducing die sizes and eliminating clock spurs, and also eliminating the need for logic devices having higher rated voltages (e.g., 5 V). Higher rated voltage devices come at a higher cost than standard voltage logic devices and are often mutually exclusive with the lowest noise FETs desired for a LNA.

Figure 1:
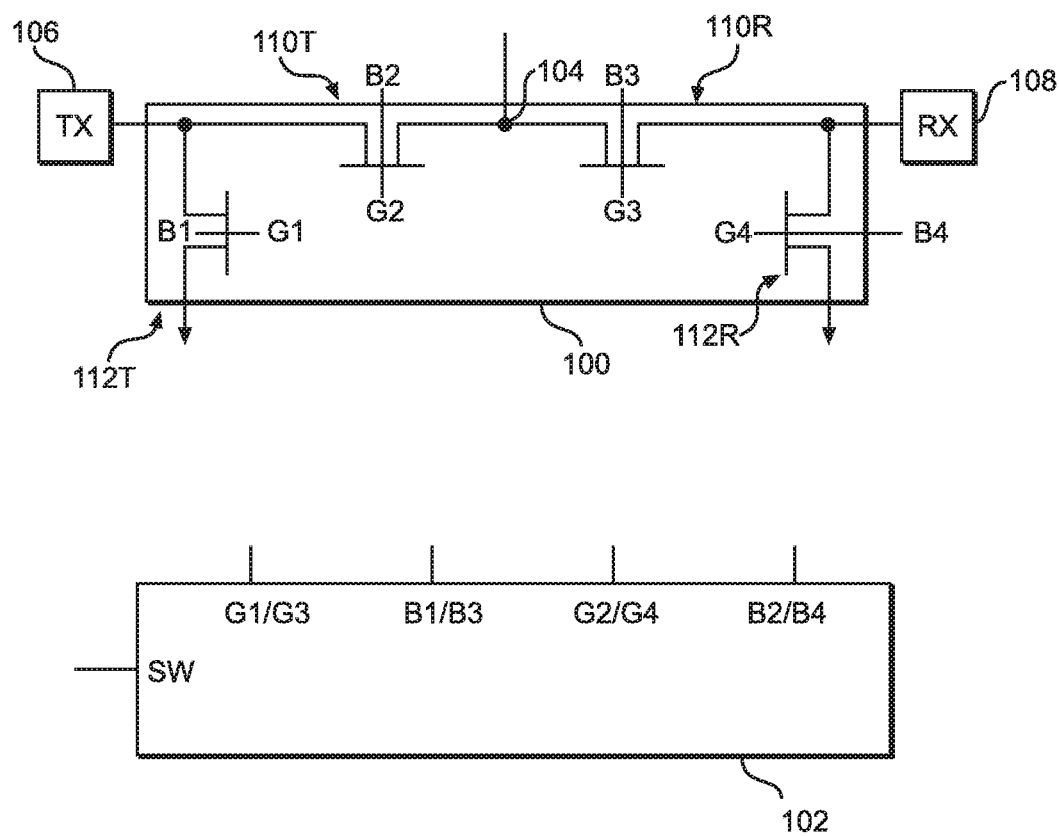
FIG. 1 is a schematic diagram of a conventional RF switch circuit and controller in which the controller employs a charge pump to provide a negative rated voltage to metal-oxide semiconductor (MOS) Field-Effect Transistor (FET) (MOSFET) switches.
Figure 2:
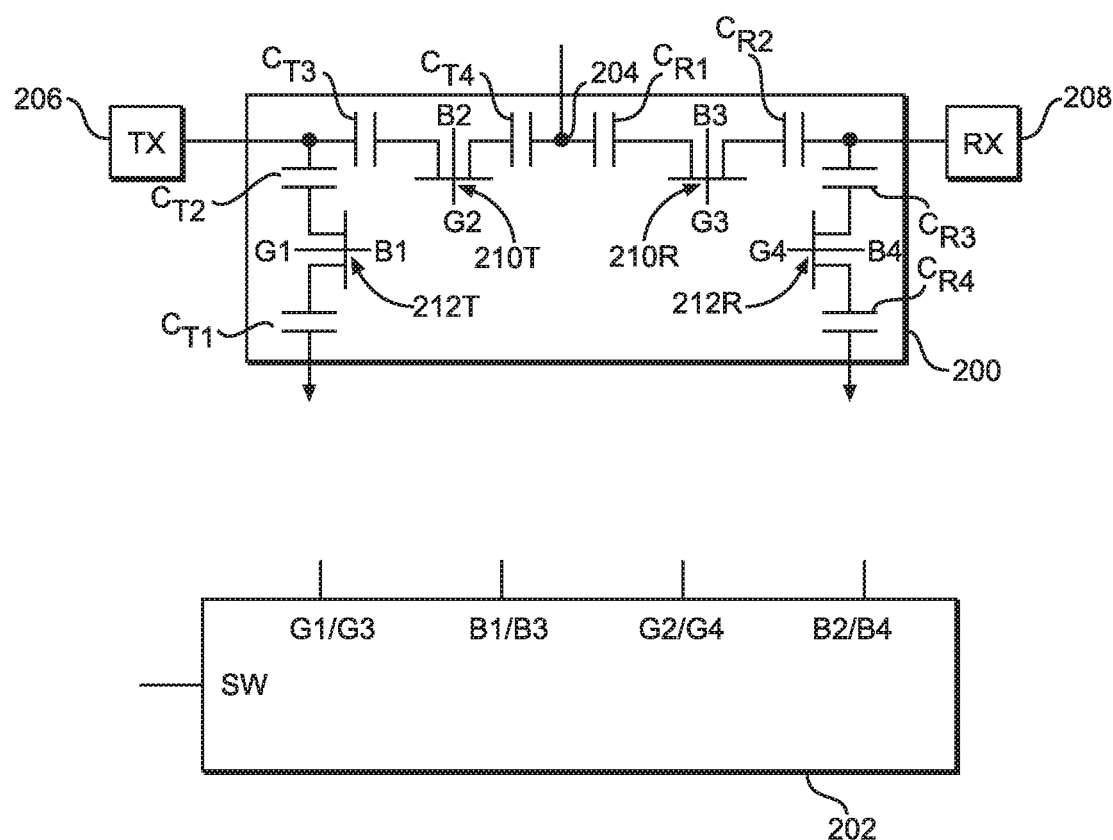
FIG. 2 is a schematic diagram of a conventional RF switch circuit and controller in which the RF switch circuit includes capacitors coupled to every MOSFET switch drain and source.
Figure 3:
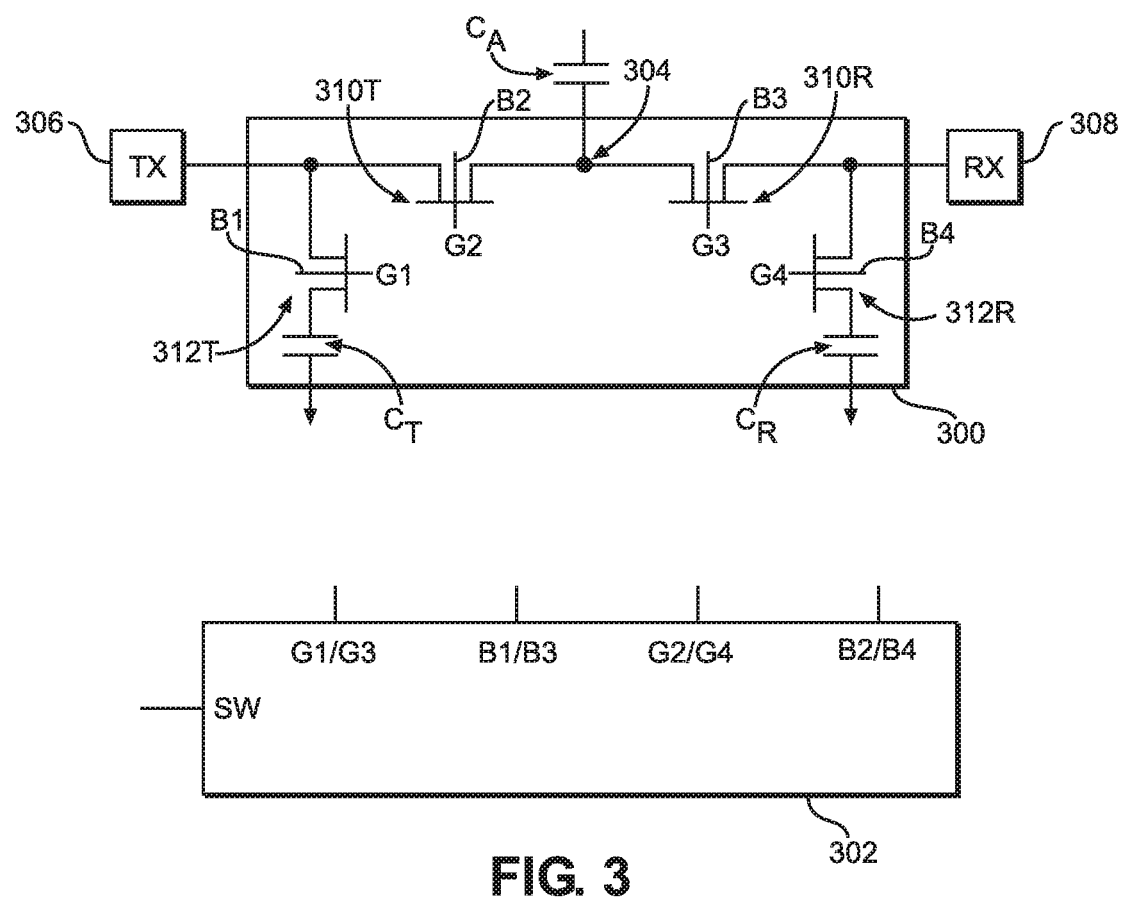
FIG. 3 is a schematic diagram of a conventional RF switch circuit and controller in which the MOSFET switches in the RF switch circuit are weakly biased.

None of the examples in FIGS. 1-3 make use of a power supply voltage $V_{DD}$ having a magnitude that is approximately twice the magnitude of a rated voltage $V_{MAX}$ of the MOSFETs in an RF switch circuit to provide strong positive and negative gate-to-source voltages without the need for a charge pump or for dynamically charging and discharging capacitors. In the RF switch circuit disclosed in detail below, by setting a source node voltage of a MOSFET to a medial voltage $V_{MED}$ approximately one half of the power supply voltage $V_{DD}$ (e.g., +2.5 V medial voltage $V_{MED}$ with a +5.0 V power supply voltage $V_{DD}$), a strong positive gate-to-source voltage $V_{GS}$ can be applied by supplying the power supply voltage $V_{DD}$ (e.g., 5 V) to the gate node. Conversely, a strong negative gate-to-source voltage $V_{GS}$ can be applied to a MOSFET by supplying the reference voltage $V_{REF}$ (e.g., 0 V) to the gate node. Thus, a HVCC capable of providing control signals with voltages from the reference voltage $V_{REF}$ to the power supply voltage $V_{DD}$ is needed. To turn on a MOSFET with a medial voltage $V_{MED}$ supplied to a source node, control signals provide the medial voltage $V_{MED}$ and the power supply voltage $V_{DD}$. To turn off a MOSFET with the medial voltage $V_{MED}$ supplied to a source node, control signals provide the reference voltage $V_{REF}$ and the medial voltage $V_{MED}$. A HVCC as disclosed herein provides control voltages ranging from a reference voltage $V_{REF}$ (e.g., 0 V) to a power supply voltage $V_{DD}$ (e.g., 5 V) with standard CMOS logic circuits for a low cost, low power, highly reliable, spur-free RF switch circuit, as explained in more detail with regard to FIGS. 4A-9.

Figure 4A:
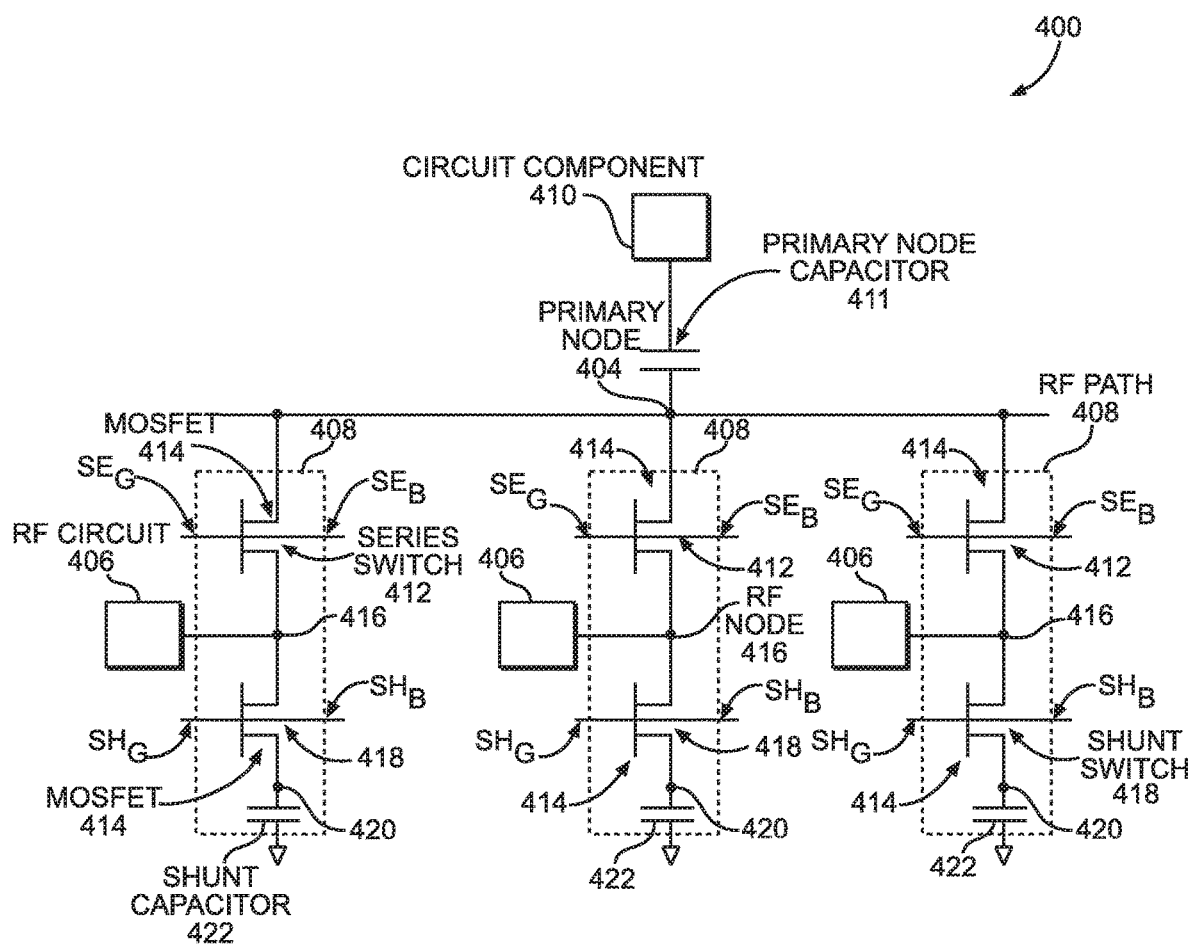
FIGS. 4A and 4B are schematic diagrams of an exemplary RF switch circuit and a high voltage control circuit (HVCC), respectively, the HVCC employing standard CMOS logic devices to generate gate control signals and body bias signals to fully turn on and fully turn off MOSFETs in the RF switch circuit from a power supply voltage.
Figure 4B:
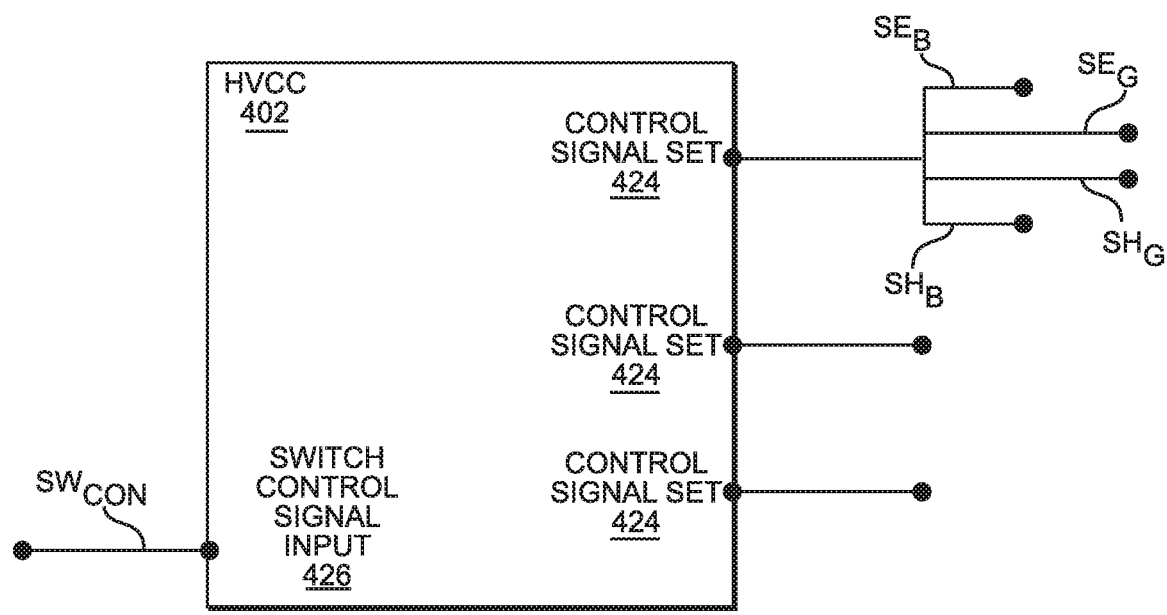

FIG. 4A is a schematic diagram of an RF switch circuit 400, and FIG. 4B is a schematic diagram of a HVCC 402 for controlling the RF switch circuit 400. The RF switch circuit 400 in FIG. 4A includes a primary node 404 that may be electrically coupled to any one of a plurality of RF circuits 406 over one of electrical paths (RF paths) 408, while the other RF paths 408 keep the primary node 404 electrically isolated from the other RF circuits 406. For example, in a first mode, the primary node 404 may be electrically coupled to the RF circuit 406 in a first RF path 408 and electrically isolated from RF circuits 406 in second and third RF paths 408 and, in a second mode, the primary node 404 may be electrically coupled to the RF circuit 406 in a second RF path 408 and electrically isolated from RF circuits 406 in first and third RF paths 408. The primary node 404 may be coupled to a circuit component 410 through a primary node capacitor 411, such as an RF antenna (not shown), to allow a selected one of the RF circuits 406 to transmit or receive wireless communication via the antenna.

The HVCC 402 in FIG. 4B provides low voltage and high voltage control signals to control operation of the RF switch circuit 400. In a TDD system, the HVCC 402 turns on a selected one of the RF paths 408 to electrically couple an RF circuit 406 to the primary node 404, while turning off the unselected RF paths 408 to electrically isolate the primary node 404 from RF circuits 406 coupled to the unselected RF paths 408. A detailed description of the RF switch circuit 400 is first provided as context for understanding the detailed description of the HVCC 402 presented below.

In FIG. 4A, three RF paths 408 are shown as an example, but the RF switch circuit 400 may include two, four, five, or more RF paths 408. Each of the RF paths 408 includes a series switch 412 coupled to the primary node 404. Each of the series switches 412 may be a MOSFET 414 having a maximum rated voltage (rated voltage $V_{MAX}$). The rated voltage $V_{MAX}$ is a maximum voltage that can be applied between any two nodes or terminals of the MOSFET 414 without causing permanent damage to the MOSFET 414. For example, neither a gate-to-source voltage $V_{GS}$ nor a drain-to-source voltage $V_{DS}$ can exceed the rated voltage $V_{MAX}$. Applying the rated voltage $V_{MAX}$ as a positive gate-to-source voltage $V_{GS}$ strongly turns on the MOSFET 414, and applying the rated voltage $V_{MAX}$ as a negative gate-to-source voltage $V_{GS}$ strongly turns off the MOSFET 414. The rated voltage $V_{MAX}$ is a characteristic of a standard CMOS technology node, which decreases in magnitude as a gate length decreases in each new technology node. The series switch 412 in each RF path 408 is also configured to couple to a corresponding RF node 416, which is further coupled to a corresponding one of the RF circuits 406. Thus, a series switch 412 is configured to electrically couple the corresponding RF node 416 to the primary node 404 when the MOSFET 414 of the series switch 412 is turned on. The series switch 412 is turned on in response to a gate node-to-source node voltage and a body bias voltage of the series switch 412.

Each of the RF paths 408 may further include a shunt switch 418 having the rated voltage $V_{MAX}$. For example, the shunt switch 418 in each of the RF paths 408 may be a MOSFET 414. The shunt switch 418 is configured to couple the RF node 416 to a shunt node 420, or to electrically isolate the RF node 416 from the shunt node 420. The RF paths 408 may further include a shunt capacitor 422 coupled between the shunt node 420 and a reference, such as ground, having a reference voltage $V_{REF}$ (e.g., 0 V).

The HVCC 402 in FIG. 4B generates the control signals needed to selectively couple one of the RF circuits 406 to a circuit component 410, such as an antenna coupled to the primary node 404. The control signals generated by the HVCC 402 supply voltage levels for controlling the series switches 412 and the shunt switches 418 in each of the RF paths 408 in the RF switch circuit 400. The control signals generated by the HVCC 402 may include a reference voltage $V_{REF}$ (e.g., ground), a power supply voltage $V_{DD}$, and a medial voltage $V_{MED}$, wherein the medial voltage $V_{MED}$ is a voltage approximately midway between the reference voltage $V_{REF}$ and the power supply voltage $V_{DD}$. In the example in FIGS. 4A and 4B, the power supply voltage $V_{DD}$ may be 5.0 V, and standard CMOS devices employed therein may have a rated voltage $V_{MAX}$ of 2.5 V, but the voltage values herein are merely examples used for purposes of explanation. In another example, the power supply voltage $V_{DD}$ could be 3.3 V, and the rated voltage $V_{MAX}$ of the standard CMOS used therein could be approximately 1.7 V. Other power supply voltages and corresponding CMOS rated voltages are within the scope of the present disclosure. Herein, a voltage within five percent (5%) of the maximum DC voltage of power supplied to a circuit is referred to as the power supply voltage $V_{DD}$, and a voltage within 5% of half of the power supply voltage $V_{DD}$ is referred to as a medial voltage $V_{MED}$. For example, when a maximum DC voltage supplied to a circuit is 5.0 V, a voltage in the range from 4.75 V to 5.25 V may be referred to as the power supply voltage $V_{DD}$, and a voltage in the range from 2.25 V to 2.75 V may be referred to as the medial voltage $V_{MED}$.

In the example in FIGS. 4A and 4B, a power supply voltage $V_{DD}$ provided to the RF switch circuit 400 and the HVCC 402 is 5 V (5.0 V), and a reference voltage $V_{REF}$ is at ground, having a voltage of 0 V. As a result, the medial voltage $V_{MED}$ is about 2.5 V. According to this example, a difference in voltage between the reference voltage $V_{REF}$ (0 V) and the medial voltage $V_{MED}$ (2.5 V) is approximately the rated voltage $V_{MAX}$ of standard MOSFETs having a rated voltage $V_{MAX}$ of 2.5 V. Similarly, a difference in voltage between the medial voltage $V_{MED}$ (2.5 V) and the power supply voltage $V_{DD}$ (5.0 V) is approximately the rated voltage $V_{MAX}$ of the standard MOSFETs having a rated voltage $V_{MAX}$ of 2.5 V.

As noted above, each of the RF paths 408 includes a series switch 412, a shunt switch 418, and a shunt capacitor 422. Each of the RF paths 408 is set to one of a coupling state and an isolation state by control signals from the HVCC 402. While one of the RF paths 408 is in the coupling state, all the other RF paths 408 in the RF switch circuit 400 are in the isolation state. In the RF path 408 in the coupling state, the series switch 412 is turned on and the shunt switch 418 is turned off. In the RF path(s) 408 in the isolation state, the series switch 412 is turned off and the shunt switch 418 is turned on. Thus, positive gate-to-source voltages are needed to turn on switches in all the RF paths 408, and negative gate-to-source voltages are needed to turn off switches in all the RF paths 408. To achieve both positive and negative voltages that are sufficient to strongly turn on and turn off switches in the RF paths 408, a source (or drain) node voltage of all switches in the RF paths 408 is set to the medial voltage $V_{MED}$ between the reference voltage $V_{REF}$ and the power supply voltage $V_{DD}$. This is accomplished by setting the DC voltage level of the shunt nodes 420 and the primary node 404 to the medial voltage $V_{MED}$, which is further accomplished by charging the shunt capacitors 422 to the medial voltage $V_{MED}$. In this manner, all of the switches in the RF paths 408 have a node set to the medial voltage $V_{MED}$. In addition, a difference in magnitude between the reference voltage $V_{REF}$ and the power supply voltage $V_{DD}$ exceeds the magnitude of the rated voltage $V_{MAX}$ of the series switch 412 and the shunt switch 418. Therefore, switches can be strongly turned on by supplying the power supply voltage $V_{DD}$ to their respective gate nodes, and switches can be strongly turned off by supplying the reference voltage $V_{REF}$ to their respective gate nodes.

In the RF path 408 that is in the coupling state, the series switch 412 is turned on to electrically couple the RF node 416 to the primary node 404, providing a low-resistance path between the RF circuit 406 coupled to the RF node 416 and the circuit component 410 coupled to the primary node 404. The series switch 412 is fully turned on by applying a positive gate-to-source voltage $V_{GS}$. Specifically, the series switch 412 is fully turned on by a signal supplying the power supply voltage $V_{DD}$ to the gate node and a signal supplying the medial voltage $V_{MED}$ to the body bias node. The shunt switch 418 of the RF path 408 in the coupling state is turned off to electrically isolate the RF node 416 from the shunt node 420. To fully turn off the shunt switch 418, a negative gate-to-source voltage $V_{GS}$ is applied by a signal supplying the reference voltage $V_{REF}$ to the gate node of the shunt switch 418. To enhance the turn off state of the shunt switch 418, a signal having the reference voltage $V_{REF}$ is also supplied to the body bias node of the shunt switch 418. The signals supplying the voltages to the gate nodes and body bias nodes are generated by the HVCC 402.

In each RF path 408 in the isolation state, the series switch 412 is turned off to electrically isolate the corresponding RF node 416 from the primary node 404. Thus, the corresponding RF circuit 406 is electrically isolated from the circuit component 410. To fully turn off the series switch 412, a negative gate-to-source voltage $V_{GS}$ is applied by a signal supplying the reference voltage $V_{REF}$ to the gate node of the series switch 412. To enhance the turn off state of the series switch 412, a signal having the reference voltage $V_{REF}$ is also supplied to the body bias node. The shunt switch 418 in each RF path 408 in the isolation state is turned on to electrically couple the corresponding RF node 416 to the corresponding shunt node 420. The shunt switch 418 is fully turned on by applying a positive gate-to-source voltage $V_{GS}$. Specifically, the shunt switch 418 is fully turned on by a signal supplying the power supply voltage $V_{DD}$ to the gate node and, to enhance the turn on state of the shunt switch 418, a signal having the medial voltage level $V_{MED}$ is supplied to the body bias node of the shunt switch 418. In the RF paths 408 in the isolation state, the shunt capacitors 422 coupled between the shunt nodes 420 and the reference (e.g., ground) provide low-resistance paths to dissipate any AC signals at the corresponding RF nodes 416.

Signals supplying the voltage levels to the gate nodes and the body bias nodes of the series switches 412 and the shunt switches 418 are provided by the HVCC 402 in FIG. 4B. Each RF path 408 receives a set of signals including a shunt switch gate node signal (shunt gate signal) $SH_G$, a shunt switch body bias node signal (shunt bias signal) $SH_B$, a series switch gate node signal (series gate signal) $SE_G$, and a series switch body bias node signal (series bias signal) $SE_B$. The shunt gate signal $SH_G$, shunt bias signal $SH_B$, series gate signal $SE_G$, and series bias signal $SE_B$ provided to a particular RF path node 408 are referred to as a control signal set 424. HVCC 402 generates a control signal set 424 for each of the RF paths 408 in the RF switch circuit 400.

As explained below, the HVCC 402 generates the control signal sets 424 based on a switch control signal input 426 configured to receive a switch control signal $SW_{CON}$. The switch control signal $SW_{CON}$ is provided by a separate circuit that determines which of the RF paths 408 is coupled to the primary node 404. In other words, the switch control signal $SW_{CON}$ identifies which of the RF circuits 406 is electrically coupled to the primary node 404 while the other RF circuits 406 are electrically isolated from the primary node 404. The switch control signal $SW_{CON}$ in the example is a binary signal having a number of bits. The number of bits in the switch control signal $SW_{CON}$ depends on the number of RF paths 408 in the RF switch circuit 400. In the example in FIG. 4A, the RF switch circuit 400 includes three RF paths 408, which can be uniquely identified by two (2) binary bits. Thus, the HVCC 402 receives a switch control signal $SW_{CON}$ having two (2) signals indicating binary values as voltage levels, with a high voltage corresponding to an asserted state and a low voltage corresponding to a non-asserted state. In another example, a low voltage may indicate the asserted state and the high voltage may indicate a non-asserted state.

FIG. 5 is a schematic diagram of a HVCC 500 according to the HVCC 402 in FIG. 4B. The HVCC 500 includes a path decoder 502, a medial voltage generator circuit 504, logic level shifters 506(SE1)-506(SE3) and 506(SH1)-506(SH3), and high voltage range switch driver (HVSD) circuits 508(SE1)-508(SE3) and 508(SH1)-508(SH3). Each of the logic level shifters 506(SE1)-506(SE3) and each of the HVSD circuits 508(SE1)-508(SE3) corresponds to a series switch 412 in one of the RF paths 408. Each of the logic level shifters 506(SH1)-506(SH3) and each of the HVSD circuits 508(SH1)-508(SH3) corresponds to a shunt switch 418 in one of the RF paths 408. For example, the logic level shifter 506(SE1) and the HVSD circuit 508(SE1) correspond to the series switch 412 in a first one of the RF paths 408, and the logic level shifter 506(SH1) and the HVSD circuit 508(SH1) correspond to the shunt switch 418 in the first one of the RF paths 408.

The medial voltage generator circuit 504 generates the medial voltage $V_{MED}$ from the power supply voltage $V_{DD}$ and the reference voltage $V_{REF}$. The path decoder 502 is configured to receive the switch control signal $SW_{CON}$ at the switch control signal input 426. In response to a binary value of the switch control signal $SW_{CON}$, the path decoder 502 asserts one of the outputs 510 indicating which of the RF paths 408 is in the coupled state. Each of the logic level shifters 506(SE1)-506(SE3) and 506(SH1)-506(SH3) receives, at a logic input 512, a signal based on a corresponding one of the outputs 510. For example, the logic level shifter 506(SE1) may receive at the logic input 512 a signal 514 generated on a first one of the outputs 510 of the path decoder 502. A binary state of the logic input 512 indicates whether the corresponding RF path 408 is in the coupled state or the isolated state. In the example, if the binary state of the logic input 512 indicates that the corresponding RF path 408 is in the coupled state, then the series switch 412 is to be turned on. In response to the logic input 512, the logic level shifter 506(SE1) generates a low-voltage binary signal 516(SE1) and a high-voltage binary signal 518(SE1), each having a binary state corresponding to the binary state at the logic input 512. The HVSD circuit 508(SE1) receives the low-voltage binary signal 516(SE1) and the high-voltage binary signal 518(SE1) from the logic level shifter 506(SE1) and generates a gate node signal and a body bias node signal with appropriate voltages for turning on the series switch 412 of the corresponding RF path 408. In a corresponding manner, the logic level shifter 506(SH1) and the HVSD circuit 508(SH1) generate a gate node signal and a body bias node signal with appropriate voltages for turning off the shunt switch 418 of the corresponding RF path 408. The shunt switch 418 and the series switch 412 are always in opposite states, which may be achieved by, for example, the logic input 512 received at the logic level shifter 506(SH1) being the binary inverse of the logic input 512 received at the logic level shifter 506(SE1), or by another comparable method. In this example, the other RF paths 408 are in the isolated state, so the series switches 412 are turned off by the logic level shifters 506(SE2)-506(SE3) and the HVSD circuits 508(SE2)-508(SE3), and the shunt switches 418 are turned on by the logic level shifters 506(SH2)-506(SH3) and the HVSD circuits 508(SH2)-508(SH3).

Figure 6:
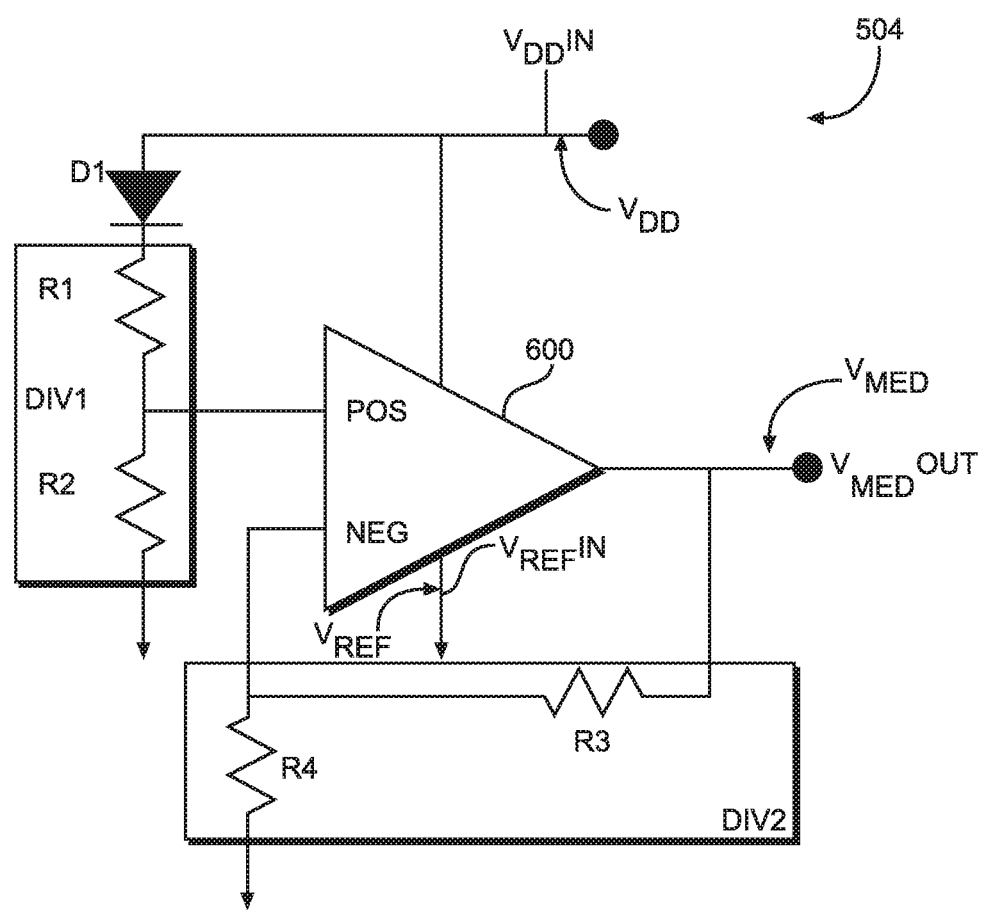
FIG. 6 is a schematic diagram of an exemplary medial voltage generator of the HVCC in FIG. 5, for generating a medial voltage between the power supply voltage and ground.

FIG. 6 is a schematic diagram of the medial voltage generator circuit 504. The medial voltage generator circuit 504 generates a voltage approximately midway between the reference voltage $V_{REF}$ and the power supply voltage $V_{DD}$.

The medial voltage generator circuit 504 includes an operational amplifier (op amp) 600 having a very low output impedance. The op amp 600 includes a power supply voltage input $V_{DD}IN$ configured to receive the power supply voltage $V_{DD}$, a reference voltage input $V_{REF}IN$ configured to receive the reference voltage $V_{REF}$, and a medial voltage output $V_{MED}OUT$ configured to generate the medial voltage $V_{MED}$ between the reference voltage $V_{REF}$ and the power supply voltage $V_{DD}$. The op amp 600 includes a positive input node POS coupled between a first resistor R1 and a second resistor R2, which form a first voltage divider DIV1. The first resistor R1 is coupled to the power supply voltage $V_{DD}$, and the second resistor R2 is coupled to the reference voltage $V_{REF}$. The op amp 600 includes a negative input node NEG coupled between a third resistor R3 and a fourth resistor R4, which form a second voltage divider DIV2. The third resistor R3 is coupled to the medial voltage output $V_{MED}OUT$, and the resistor R4 is coupled to the reference voltage $V_{REF}$. The op amp 600 is configured to generate the medial voltage $V_{MED}$ on the medial voltage output $V_{MED}OUT$ in response to a voltage difference between the positive input node POS and the negative input node NEG.

A positive input to the op amp 600 is referenced to the power supply voltage $V_{DD}$, which allows the output to scale with the power supply voltage $V_{DD}$. The output $V_{MED}$ from the op amp 600 in the medial voltage generator circuit 504 corresponds to the equation:

$$V_{MED}=(1+R3/R4)*(V_{DD}-V_{DIODE})*(R2/(R2+R1));$$

where $V_{DIODE}$ is a voltage drop across diode D1 in FIG. 6.

As an alternative, the medial voltage $V_{MED}$ could be generated by an N-type FET (NFET) source follower circuit instead of the op amp 600, as known in the art, but the NFET source follower's output impedance would be higher than the output impedance of the op amp 600.

FIG. 7 is a schematic diagram of a logic level shifter 700 corresponding to the logic level shifters 506(SE1)-506(SE3) and 506(SH1)-506(SH3) in FIG. 5. The logic level shifter 700 includes a reference voltage node $V_{REF}$ for receiving the reference voltage $V_{REF}$, a power supply voltage node $V_{DD}$ for receiving the power supply voltage $V_{DD}$, and a medial voltage node $V_{MED}$ for receiving the medial voltage $V_{MED}$. The logic level shifter 700 includes the logic input 512 configured to receive a signal generated by standard CMOS compatible logic. A binary state of the logic input 512 indicates which of the RF paths 408 is selected to be coupled to the primary node 404. The signal received at the logic input 512 has one of a first binary state and a second binary state. The logic level shifter 700 includes a low-voltage binary output 702 configured to generate a low-voltage binary signal 704, which corresponds to the low-voltage binary signal 516(SE1) in the example above. The logic level shifter 700 also includes a high-voltage binary output 706 configured to generate a high-voltage binary signal 708, which corresponds to the high-voltage binary signal 518(SE1) in the example above. Each of the low-voltage binary output 702 and the high-voltage binary output 706 indicates the same binary state as the logic input 512.

In particular, inverter 10 and inverter 11 are configured to generate one of the reference voltage $V_{REF}$ (e.g., 0 V) and the medial voltage $V_{MED}$ on the low-voltage binary output 702 that indicates the binary value of the logic input 512. For example, in response to a non-asserted state on the logic input 512, the non-asserted state of the low-voltage binary output 702 may be 0 V, and in response to an asserted state on the logic input 512, the low-voltage binary output 702 may have a voltage representing an asserted state (e.g., 2.5 V).

The remaining components of the logic level shifter 700 include inverters 12-15, diodes D1 and D2, and transistors T1-T4, and together these remaining components, in a manner understood by persons of skill in the art, shift the voltage level of the binary states received on the logic input 512 to voltages in the range from the medial voltage $V_{MED}$ to the power supply voltage $V_{DD}$. Thus, the inverter 15 will generate a voltage on the high-voltage binary output 706 that will be either the medial voltage $V_{MED}$ or the power supply voltage $V_{DD}$. For example, in response to an asserted state on the logic input 512, the high-voltage binary output 706 may be in an asserted state at the power supply voltage $V_{DD}$ (e.g., 5 V), and in response to a non-asserted state on the logic input 512, the non-asserted state of the high-voltage binary output 706 may be the medial voltage $V_{MED}$ (e.g., 2.5 V).

FIG. 8 is a schematic diagram of a HVSD circuit 800 corresponding to the HVSD circuits 508(SE1)-508(SE3) and 508(SH1)-508(SH3) in the example in FIG. 5. The HVSD circuit 800 is supplied with the power supply voltage $V_{DD}$, the medial voltage $V_{MED}$, and the reference voltage $V_{REF}$. The HVSD circuit 800 includes a low-voltage logic input 802 configured to receive the low-voltage binary signal 704 generated on the low-voltage binary output 702 in FIG. 7. The HVSD circuit 800 also includes a high-voltage logic input 804 configured to receive the high-voltage binary signal 708 generated on the high-voltage binary output 706. The HVSD circuit 800 includes a body bias control output 806, which is coupled to a body bias node of a MOSFET, and a gate control output 808, which is coupled to a gate node of the MOSFET. In response to the low-voltage binary output 702 and the high-voltage binary output 706 of the logic level shifter 700, the body bias control output 806 is configured to generate one of the reference voltage $V_{REF}$ and the medial voltage $V_{MED}$, and the gate control output 808 is configured to generate one of the medial voltage $V_{MED}$ and the power supply voltage $V_{DD}$.

The low-voltage logic input 802 and the high-voltage logic input 804 are buffered in a buffer 810 and provided to driver circuits DRVB and DRVG. The body bias control output 806 is configured to be coupled to a body bias node of a MOSFET (not shown), and the gate control output 808 is configured to be coupled to a gate node of the MOSFET. In response to the low-voltage logic input 802 and the high-voltage logic input 804 both having a non-asserted state (e.g., 0 V and 2.5 V, respectively), the driver circuit DRVB generates the reference voltage $V_{REF}$ on the body bias control output 806 to bias the MOSFET for the turned off state, and the driver circuit DRVG generates the reference voltage $V_{REF}$ to apply a negative gate-to-source voltage $V_{GS}$ to turn off the MOSFET. In response to the low-voltage logic input 802 and the high-voltage logic input 804 both having an asserted state (e.g., 2.5 V and 5 V, respectively), the driver circuit DRVB generates the medial voltage $V_{MED}$ on the body bias control output 806 to bias the MOSFET for the turned on state, and the driver circuit DRVG generates the power supply voltage $V_{DD}$ to apply a positive gate-to-source voltage $V_{GS}$ to turn on the MOSFET.

What is claimed is:

1. A radio frequency (RF) switch circuit, comprising:
   a primary node configured to couple to a circuit component;
   a first RF path, comprising:
      a first series switch having a rated voltage, the first series switch configured to couple a first RF node to the primary node in response to a gate node-to-source node voltage and a body bias voltage of the first series switch;
   a second RF path, comprising:
      a second series switch having the rated voltage, the second series switch configured to couple a second RF node to the primary node in response to a gate node-to-source node voltage and a body bias voltage of the second series switch; and
   a high voltage control circuit configured to:
      supply a reference voltage to a gate node and a body bias node of a first one of the first and second series switches;
      supply a power supply voltage to the gate node of a second one of the first and second series switches; and
      supply a medial voltage between the reference voltage and the power supply voltage to the body bias node of the second one of the first and second series switches;
   wherein a difference in magnitude between the reference voltage and the power supply voltage exceeds the magnitude of the rated voltage of the first and second series switches.

2. The RF switch circuit of claim 1, wherein:
   the first RF path further comprises a first shunt switch having the rated voltage, the first shunt switch configured to couple the first RF node to a first shunt node; and
   the second RF path further comprises a second shunt switch having the rated voltage, the second shunt switch configured to couple the second RF node to a second shunt node.

3. The RF switch circuit of claim 2, wherein:
   the first RF path further comprises a first shunt capacitor coupled between the first shunt switch and a reference having the reference voltage; and
   the second RF path further comprises a second shunt capacitor coupled between the second shunt switch and the reference having the reference voltage.

4. The RF switch circuit of claim 1, wherein the circuit component comprises an RF antenna.

5. The RF switch circuit of claim 1, wherein the high voltage control circuit comprises:
   a medial voltage generator circuit configured to generate the medial voltage between the reference voltage and the power supply voltage;
   a first logic level shifter, comprising:
      a first low-voltage binary output configured to generate a first one of the reference voltage and the medial voltage in response to a binary state of a logic input; and
      a first high-voltage binary output configured to generate a first one of the medial voltage and the power supply voltage in response to the binary state of the logic input;

a second logic level shifter, comprising:
- a second low-voltage binary output configured to generate a second one of the reference voltage and the medial voltage in response to the binary state of the logic input; and
- a second high-voltage binary output configured to generate a second one of the medial voltage and the power supply voltage in response to the binary state of the logic input;

a first high voltage switch driver (HVSD) circuit, comprising:
- a body bias control output configured to generate one of the reference voltage and the medial voltage in response to the first low-voltage binary output and the first high-voltage binary output of the first logic level shifter; and
- a gate control output configured to generate one of the reference voltage and the power supply voltage in response to the first low-voltage binary output and the first high-voltage binary output of the first logic level shifter; and a second HVSD circuit, comprising:
- a body bias control output configured to generate one of the reference voltage and the medial voltage in response to the second low-voltage binary output and the second high-voltage binary output of the second logic level shifter; and
- a gate control output configured to generate one of the reference voltage and the power supply voltage in response to the second low-voltage binary output and the second high-voltage binary output of the second logic level shifter.

6. The RF switch circuit of claim 5, wherein the medial voltage generator circuit comprises an operational amplifier, comprising:
- a medial voltage output configured to generate the medial voltage between the reference voltage and the power supply voltage;
- a positive input node coupled to a first voltage divider coupled to the power supply voltage; and
- a negative input node coupled to a second voltage divider coupled to the reference voltage;
wherein the operational amplifier is configured to generate the medial voltage on the medial voltage output in response to a voltage difference between the positive input node and the negative input node.

7. The RF switch circuit of claim 6, wherein:
the first voltage divider comprises:
- a first resistor coupled to the power supply voltage; and
- a second resistor coupled to the reference voltage; and
the second voltage divider comprises:
- a third resistor coupled to the medial voltage output; and
- a fourth resistor coupled to the reference voltage.

8. The RF switch circuit of claim 5, wherein the first and second logic level shifters each further comprise:
- a reference voltage node configured to couple to the reference voltage;
- a medial voltage node configured to couple to a medial voltage output of the medial voltage generator circuit; and
- a power supply voltage node configured to couple to the power supply voltage.

9. The RF switch circuit of claim 5, wherein:
the first low-voltage binary output of the first logic level shifter is configured to generate the medial voltage in response a first binary state of the logic input, and generate the reference voltage in response to a second binary state of the logic input; and
the first high-voltage binary output of the first logic level shifter is configured to generate the power supply voltage in response to the first binary state of the logic input, and generate the medial voltage in response the second binary state of the logic input.

10. The RF switch circuit of claim 9, wherein:
the body bias control output of the first HVSD circuit is configured to generate the medial voltage in response to the first low-voltage binary output and the first high-voltage binary output of the first logic level shifter having an asserted state, and generate the reference voltage in response to the first low-voltage binary output and the first high-voltage binary output of the first logic level shifter having a non-asserted state; and
the gate control output of the first HVSD circuit is configured to generate the power supply voltage in response to the first low-voltage binary output and the first high-voltage binary output of the first logic level shifter having the asserted state, and generate the reference voltage in response to the first low-voltage binary output and the first high-voltage binary output of the first logic level shifter having the non-asserted state.

11. The RF switch circuit of claim 1, wherein:
the first series switch further comprises a first transistor; and
the second series switch further comprises a second transistor.

12. The RF switch circuit of claim 11, wherein:
the first transistor and the second transistor each comprise a Field-Effect Transistor (FET).

13. The RF switch circuit of claim 2, wherein:
the first shunt switch further comprises a third transistor; and
the second shunt switch further comprises a fourth transistor.

14. The RF switch circuit of claim 13, wherein:
the third transistor and the fourth transistor each comprise a Field-Effect Transistor (FET).

15. The RF switch circuit of claim 11, wherein the rated voltage of the first and second series switches comprises a maximum gate-to-source voltage ($V_{GS}$) or a maximum drain-to-source voltage ($V_{DS}$), and a voltage higher than the rated voltage may cause the first and second transistors to be permanently damaged.

16. The RF switch circuit of claim 1, wherein:
a difference in voltage between the reference voltage and the medial voltage is less than or equal to the rated voltage; and
a difference in voltage between the medial voltage and the power supply voltage is less than or equal to the rated voltage.

17. A method of controlling a radio frequency (RF) switch circuit, comprising:
controlling a first series switch comprising a rated voltage to couple a first RF node of a first RF circuit to a primary node in a first mode, comprising:
- supplying a power supply voltage to a gate node of the first series switch;
- supplying a medial voltage to a body bias node of the first series switch; and
- supplying a reference voltage to a gate node of a second series switch and a body bias node of the second series switch; and controlling the second series switch comprising the rated voltage to couple a second RF node of a second RF circuit to the primary node in a second mode, comprising;

supplying the power supply voltage to the gate node of the second series switch;

supplying the medial voltage to the body bias node of the second series switch; and supplying the reference voltage to the gate node of the first series switch and the body bias node of the first series switch;

wherein a difference between the power supply voltage and the reference voltage exceeds the rated voltage of the first series switch and the second series switch.

* * * * *

UNITED STATES PATENT AND TRADEMARK OFFICE
CERTIFICATE OF CORRECTION

PATENT NO. : 10,903,821 B1  
APPLICATION NO. : 16/540573  
DATED : January 26, 2021  
INVENTOR(S) : Yan Guo and Patrick T. Clancy Page 1 of 1

It is certified that error appears in the above-identified patent and that said Letters Patent is hereby corrected as shown below:

In the Specification

Column 14, Line 61, replace "inverter 10 and inverter 11" with --inverter I0 and inverter I1--.
Column 15, Line 5, replace "inverters 12-15" with --inverters I2-I5--.
Column 15, Line 11, replace "inverter 15" with --inverter I5--.

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*